United States Patent [19]

Takano et al.

[11] Patent Number: 5,550,370

[45] Date of Patent: *Aug. 27, 1996

[54] POTENTIAL SENSOR EMPLOYING ELECTROOPTIC CRYSTAL AND POTENTIAL MEASURING METHOD

[75] Inventors: Atsushi Takano; Minoru Utsumi; Hiroyuki Obata, all of Tokyo, Japan

[73] Assignee: Dai Nippon Printing Co., Ltd., Tokyo, Japan

[ * ] Notice: The term of this patent shall not extend beyond the expiration date of Pat. No. 5,434,698.

[21] Appl. No.: 404,345

[22] Filed: Mar. 15, 1995

Related U.S. Application Data

[62] Division of Ser. No. 94,907, Jul. 20, 1993, Pat. No. 5,434,698, which is a continuation of Ser. No. 721,517, filed as PCT/JP90/01466, Nov. 13, 1990, abandoned.

[30] Foreign Application Priority Data

Nov. 13, 1989 [JP] Japan ................... 1-294367

[51] Int. Cl.$^6$ ................... G02F 1/015; G01R 31/00
[52] U.S. Cl. ................... 250/225; 359/247; 359/248; 359/252; 359/255; 257/451; 324/96; 356/364
[58] Field of Search ................... 250/225, 216; 359/247, 248, 252, 255; 257/451; 356/364, 365, 368; 324/96, 244.1, 117 R

[56] References Cited

U.S. PATENT DOCUMENTS

| | | | |
|---|---|---|---|
| 3,295,911 | 1/1967 | Ashkin et al. | 359/248 |
| 3,464,762 | 9/1969 | Kahng | 359/248 |
| 4,563,093 | 1/1986 | Tada et al. | 356/368 |
| 4,595,876 | 6/1986 | Kuhara et al. | 324/96 |
| 4,647,339 | 3/1987 | Houghton | 359/248 |
| 4,866,372 | 9/1989 | Aoshima et al. | 356/368 |
| 4,891,580 | 1/1990 | Valdmanis | 324/96 |
| 4,904,931 | 2/1990 | Miller | 356/365 |
| 4,928,058 | 5/1990 | Williamson | 324/96 |
| 4,978,910 | 12/1990 | Knox et al. | 324/96 |
| 5,006,789 | 4/1991 | Williamson | 324/96 |
| 5,025,209 | 6/1991 | Takanashi et al. | 324/96 |
| 5,029,273 | 7/1991 | Jaeger | 356/365 |
| 5,036,270 | 7/1991 | Takanashi et al. | 324/96 |
| 5,434,698 | 7/1995 | Takano et al. | 359/247 |

FOREIGN PATENT DOCUMENTS

| | | |
|---|---|---|
| 53-10461 | 4/1978 | Japan . |
| 56-150724 | 11/1981 | Japan . |
| 58-29492 | 6/1983 | Japan . |
| 62-198830 | 9/1987 | Japan . |

OTHER PUBLICATIONS

Ben G. Streetman, *Solid State Electronic Devices*, second edition, Prentice–Hall, Englewood Cliffs, N.J. 1980, p. 443.
Robert Soares et al, *Applications of GaAs MESFETS*, Artech House Inc., 1983, pp. 462–469.

(List continued on next page.)

Primary Examiner—Edward P. Westin
Assistant Examiner—John R. Lee
Attorney, Agent, or Firm—Dellett and Walters

[57] ABSTRACT

A high-resistance compound semiconductor 12 is epitaxially grown on a low-resistance compound semiconductor 11 and a dielectric reflecting film 13 is formed thereon, thereby forming a monolithic sensor 10. As the low-resistance compound semiconductor 11, a compound semiconductor is used which has a large bandgap so as to enable probe light to pass therethrough without being absorbed and which has a lattice constant and a thermal expansion coefficient, which are close to those of the high-resistance compound semiconductor. In addition, since the low-resistance compound semiconductor 11 also serves as an electrode, a compound semiconductor which has a resistivity of $10^{+1}$ $\Omega$cm or less is used. Since the shorter the wavelength of the probe light used, the larger the retardation change and the larger the signal output, a compound semiconductor which has a large bandgap is used as the high-resistance compound semiconductor 12 so that light of short wavelength can be used. The high-resistance compound semiconductor 12 is also required to have a large electrooptic constant and a resistivity of $10^5$ $\Omega$cm or more.

3 Claims, 4 Drawing Sheets

OTHER PUBLICATIONS

Edward C. Jordan, Editor in Chief, *Reference Data For Engineers; Radio, Electronics, Computer and Communications,* Seventh Edition, Howard W. Sams & Co., 1984, Chapter 4, p. 18.

Kenneth Krane, *Modern Physics,* John Wiley & Sons, Inc., 1983, Chapter 14.4, p. 406.

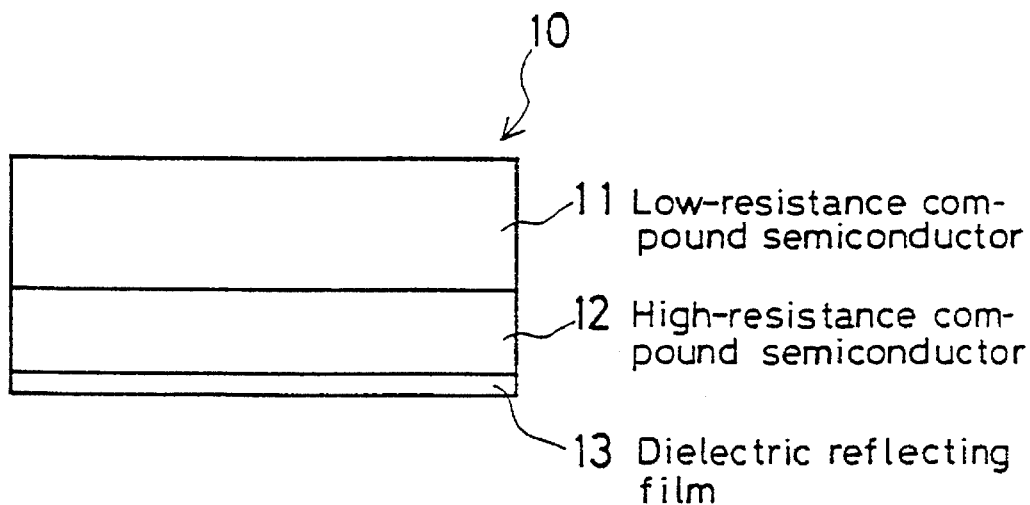
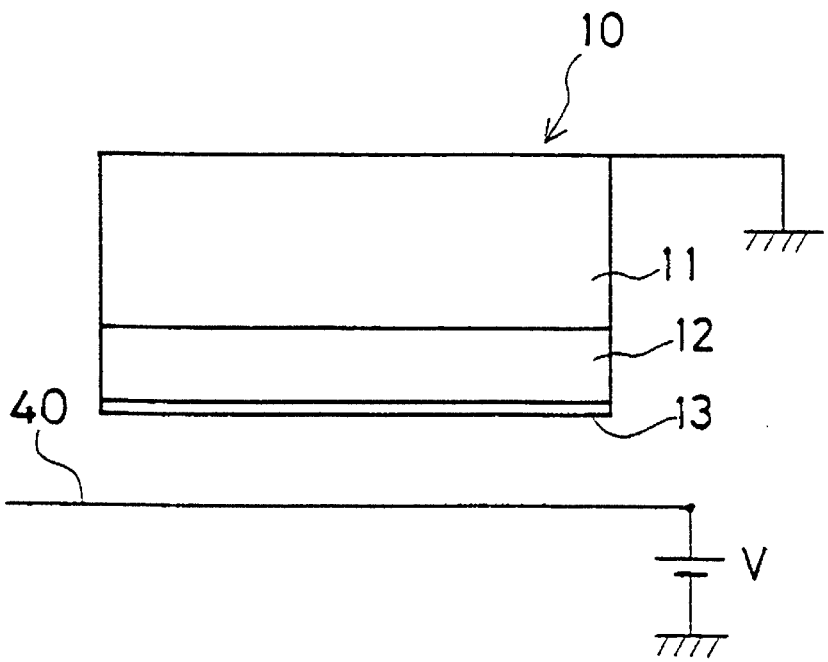

5,550,370

POTENTIAL SENSOR EMPLOYING ELECTROOPTIC CRYSTAL AND POTENTIAL MEASURING METHOD

This is a divisional of application Ser. No. 08/094,907, filed on Jul. 20, 1993, now U.S. Pat. No. 5,434,698 which is a continuation of U.S. patent application Ser. No. 07/721,517 filed on Jul. 12, 1991, now abandoned, International application PCT/JP90/01466, filed on Nov. 13, 1990, and which designated the U.S.

TECHNICAL FIELD

The present invention relates to a potential measuring apparatus employing an electrooptic crystal, in which the potential of an object is measured by making use of the fact that the optical anisotropy of an electrooptic crystal changes with the electric field. The present invention also relates to a potential measuring method carried out by use of such a potential measuring apparatus.

BACKGROUND ART

As shown in FIG. 5, an electrooptic crystal 1 is brought close to an object 3 of measurement, with a transparent electrode 2 bonded to the crystal 1 and grounded. Assuming that the object 3 has a predetermined surface potential, lines of electric force from the object 3 terminate at the electrode 2 through the electrooptic crystal 1 and a predetermined electric field is therefore applied to the electrooptic crystal 1, resulting in a change in the optical anisotropy. Since the change in the optical anisotropy is proportional to the magnitude of the electric field, if polarized light 4, for example, is applied, the polarization of the reflected or transmitted light changes. The retardation is expressed by $$\Delta\phi = \frac{2\pi}{\lambda} \cdot n^3 \gamma E l \qquad (1)$$

where $\Delta\phi$ is the retardation, n is the refractive index, $\gamma$ is the electrooptic constant, E is the electric field, l is the optical path length and $\lambda$ is the wavelength. The surface potential of the object Vs is given by $$Vs = \left( d_1 + \frac{\epsilon_1}{\epsilon_3} d_3 + \frac{\epsilon_1}{\epsilon_2} d_2 \right) E \qquad (2)$$

where $(d_1, E\epsilon_1)$, $(d_2, \epsilon_2)$ and $(d_3, \epsilon_3)$ are the thicknesses and dielectric constants of the electrooptic crystal, the air gap and the object of measurement, respectively. If the object is in contact with the electrooptic crystal (i.e., $d_2=0$) and the object is metallic (i.e., $d_3=0$), the following relationship holds:

$$Vs = Ed_1 \qquad (3)$$

In other words, El in the expression (1) corresponds to Vs, and in the case of a reflecting system, $l=2d_1$, whereas, in the case of a transmitting system, $l=d_1$. Thus, the surface potential Vs of the object can be determined by obtaining $\Delta\phi$.

This type of optical potential sensor has heretofore been produced by forming a transparent electrode (ITO) 2 on a glass substrate 6 by sputtering or the like, as shown in FIG. 6, bonding LiNbO$_3$ 1 to the surface of the transparent electrode 2 by means of an adhesive 7, grinding the LiNbO$_3$ 1 to a necessary thickness, and then forming a dielectric reflecting film 8 thereon by use of thin-film technology. Thus, the conventional optical potential sensor has a complicated structure. In addition, since the bonding step and the grinding step are involved, the production process is complicated and the processing characteristics are inferior. Further, the surface accuracy is low because of the thickness unevenness that is caused by the bonding and the grinding, which results in low measuring accuracy. In addition, since LiNbO$_3$ has optical properties which are different in all of the three directions, it is difficult to incline the Z-axis of the crystal exactly at 55° with respect to the direction of incidence of light. Further, LiNbO$_3$ involves the problem of photo-deterioration.

It is an object of the present invention to enable potential measurement using an electrooptic crystal which is easy to produce.

It is another object of the present invention to enable highly accurate potential measurement without photo-deterioration by use of an electrooptic crystal.

DISCLOSURE OF THE INVENTION

The potential sensor of the present invention is characterized by measuring a potential by use of an electrooptic crystal comprising a high-resistance compound semiconductor layer which is formed on a low-resistance compound semiconductor substrate by epitaxial growth.

In addition, the potential sensor of the present invention is characterized in that the low-resistance compound semiconductor and the high-resistance compound semiconductor each have a large bandgap.

In addition, the potential sensor of the present invention is characterized in that a dielectric reflecting film is formed on the high-resistance compound semiconductor layer.

In addition, the potential sensor of the present invention is characterized by being disposed close and in opposing relation to an object of measurement, with the low-resistance compound semiconductor substrate grounded, irradiating the object with linearly, elliptically or circularly polarized light, and measuring the potential of the object from a change in the polarization of light.

BRIEF DESCRIPTION OF THE DRAWINGS

FIG. 1 shows the arrangement of the potential sensor according to the present invention;

FIG. 4 is a view for explanation of one example of the potential detection by the potential sensor;

BEST MODE FOR CARRYING OUT THE INVENTION

Figure 2:
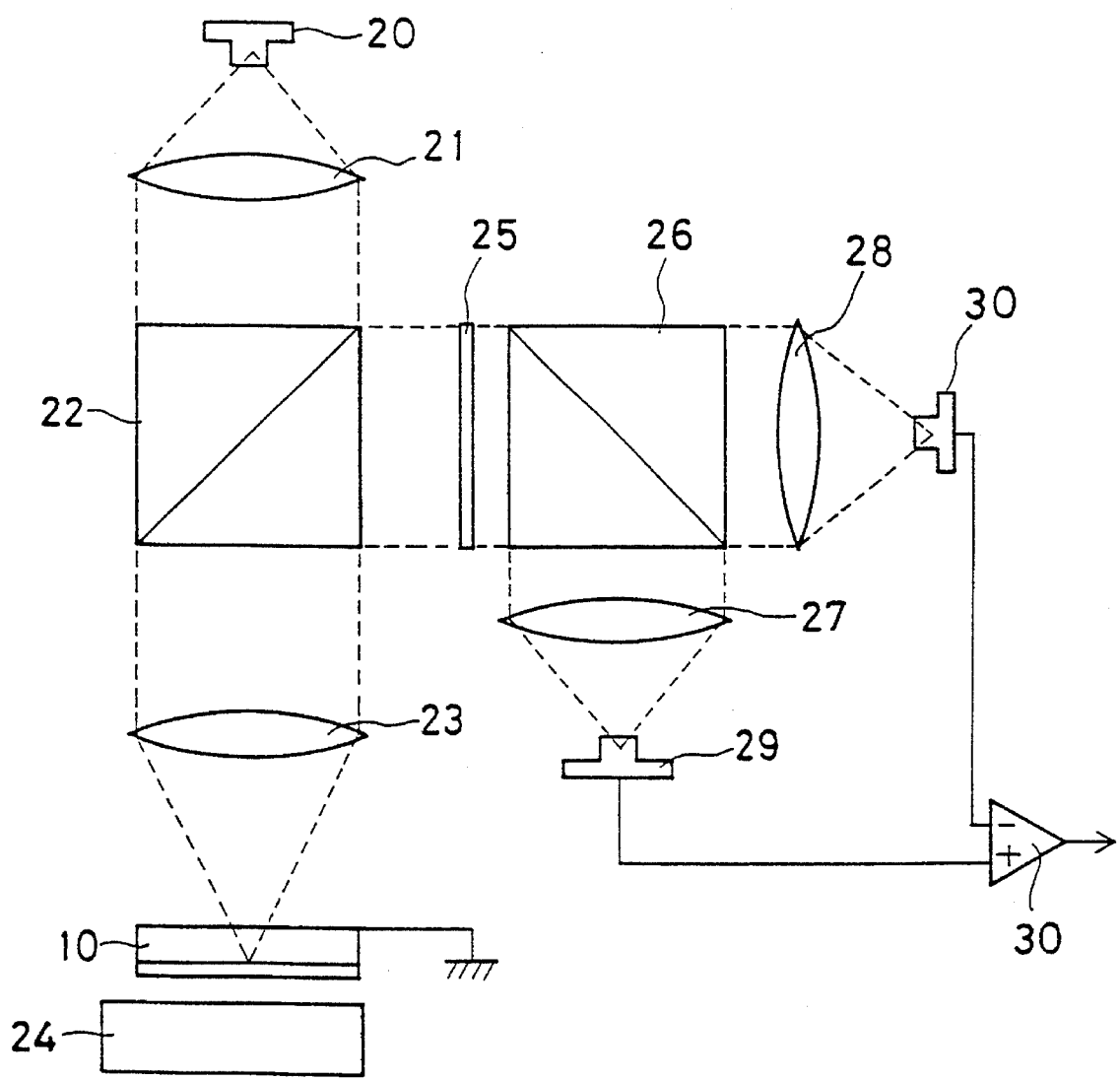
FIGS. 2 and 3 show the respective arrangements of measuring apparatuses using the potential sensor of the present invention.

FIG. 1 shows the arrangement of the sensor according to the present invention. In the figure, reference numeral 10 denotes a sensor body, 11 a low-resistance compound semiconductor, 12 a high-resistance compound semiconductor, and 13 a dielectric reflecting film.

The present invention has been accomplished by noting that a compound semiconductor optically causes double refraction when placed in an electric field and it suffers almost no deterioration by light and that a low-resistance compound semiconductor functions as a conductor. Thus, a high-resistance compound semiconductor 12 is epitaxially grown on a low-resistance compound semiconductor wafer and a dielectric reflecting film 13 is formed thereon, thereby forming a monolithic sensor.

The low-resistance compound semiconductor 11 is required to transmit probe light without absorbing it and therefore desired to have a large bandgap and also have a lattice constant and a thermal expansion coefficient, which are close to those of the high-resistance compound semiconductor which is epitaxially grown thereon. In addition, since the low-resistance compound semiconductor 11 also serves as an electrode, the resistivity thereof is preferably $10^{+1} \Omega$cm or less.

Examples of compound semiconductors which are usable as the high-resistance compound semiconductor 12 are non-doped compound semiconductors and compound semiconductors doped with a dopant having a deep level so as to have a high resistance, such as GaAs doped with Cr and CdTe doped with Cl. As will be understood from the expression (1), the shorter the wavelength of the probe light used, the larger the retardation change, and the larger the signal output. Therefore, the high-resistance compound semiconductor 12 is desired to have a large bandgap so that light of short wavelength can be used, and it is also desired to have a large electrooptic constant. Since it is desired to apply a large electric field, it is preferable that the high-resistance compound semiconductor 12 have a resistivity of $10^5$ $\Omega$cm or more.

Usable compound semiconductors are III-V group compounds, e.g., GaAs, GaP, GaN, InAs, InSb, etc., or a mixed crystal of these compounds, II-VI group compounds, e.g., ZnS, ZnSe, CdS, CdSe, CdTe, ZnTe, etc., or a mixed crystal of these compounds, and I-VII group compounds, e.g., CuCl, CuBr, etc., or a mixed crystal of these compounds. In the case of a III-V group compound, e.g., P-type GaAs is doped with Zn, Mg, Mn or Be to form a low-resistance compound semiconductor, whereas N-type GaP is doped With S, Se, Te, Si, Ge or Sn to form a low-resistance compound semiconductor. In the case of a II-VI group compound, e.g., ZnS or ZnSe is doped with Li or N to form a P-type low-resistance compound semiconductor, or it is doped with Cl to form an N-type low-resistance compound semiconductor. It is also possible to use one selected from among I-III-VI$_2$ group compounds, e.g., CuGaS$_2$, CuAlSe$_2$, etc., or a mixed crystal of these compounds, and II-VI-V$_2$ group compounds, e.g., ZnSiP$_2$, ZnGeP$_2$, CdSiP$_2$, etc., or a mixed crystal of these compounds.

The low-resistance compound semiconductor and the high-resistance compound semiconductor may form either a homo structure or hetero structure. Since the low- and high-resistance compound semiconductors are assigned different functions, if materials which are suitable for the respective functions are used, a hetero structure is formed, in general.

It should be noted that, if carriers are generated in the high-resistance compound semiconductor, the carriers act to cancel the external electric field and hence weakens the electric field in the high-resistance compound semiconductor, resulting in a lowering of the detecting sensitivity. In order to prevent the lowering of the sensitivity, the high-resistance compound semiconductor must be prevented from being exposed to light that generates photocarriers. It is also necessary to prevent the high-resistance compound semiconductor from heating up to a temperature at which thermocarriers are generated.

With the above-described arrangement, if a semiconductor wafer doped with impurities at an appropriate concentration is used as the low-resistance compound semiconductor, the surface accuracy is extremely high, and since the high-resistance compound semiconductor is epitaxially grown on this semiconductor wafer, the crystallographic axes are determined by those of the wafer. Accordingly, if a semiconductor wafer with crystallographic axes extending in given directions is selected in advance, the crystallographic axes of a layer epitaxially grown thereon are automatically set to optimal values. Although in the foregoing the present invention has been described by way of one example in which potential measurement is effected by use of reflected light, it should be noted that potential measurement can be similarly effected by use of transmitted light. In such a case, no dielectric reflecting film is needed, as a matter of course, and the object of measurement also needs to transmit the light for measurement.

FIG. 2 shows the arrangement of one embodiment of a potential measuring apparatus employing the sensor of the present invention.

Linearly polarized light from a laser diode 20 is collimated through a condenser lens 21 and applied to the sensor 10 of the present invention through a half-mirror 22 and an objective lens 23. The optical anisotropy of the sensor 10 changes with the potential of an object 24 of measurement that is disposed in opposing relation and close proximity to the sensor 10. In consequence, a reflected light component in a predetermined optical axis direction causes a retardataion, resulting in elliptically polarized light. The elliptically polarized light is reflected from the half-mirror 22 and passed through, for example, a halfwave plate 25 whereby the component retarded by the sensor 10 and a component orthogonal thereto are mixed together, and the resulting light is divided by a polarization beam splitter 26 into two beams, which are condensed through respective lenses 27 and 28 and detected by respective light-receiving elements 29 and 30. The detection outputs are amplified in a differential amplifier 31. Thus, even if the light quantity from the light source changes, the change in the light quantity is removed, so that it is possible to detect the signal component only. At this time, the output of the differential amplifier 31 is proportional to $$\sin(\Delta\phi+\alpha)$$

where $\Delta\phi$ is given by the expression (1), and $\alpha$ is a phase factor.

The best linearity of the output with respect to the potential is obtained in the vicinity of $\Delta\phi=-\alpha$. Accordingly, a potential range in which the linearity is required can be determined by disposing a proper phase compensator in the optical path, for example, in between the condenser lens 21 and the half-mirror 22 and moving $\alpha$. When a quarter-wave plate is employed, $\alpha=0$ is valid in an ideal optical system, and the best linearity is obtained when the potential is in the vicinity of 0.

In a case where the light emitted from the laser diode is elliptical and the beam spot is desired to be circular, a beam shaping prism should be inserted in the optical path, for example, in between the condenser lens 21 and the half-mirror 22.

Figure 3:
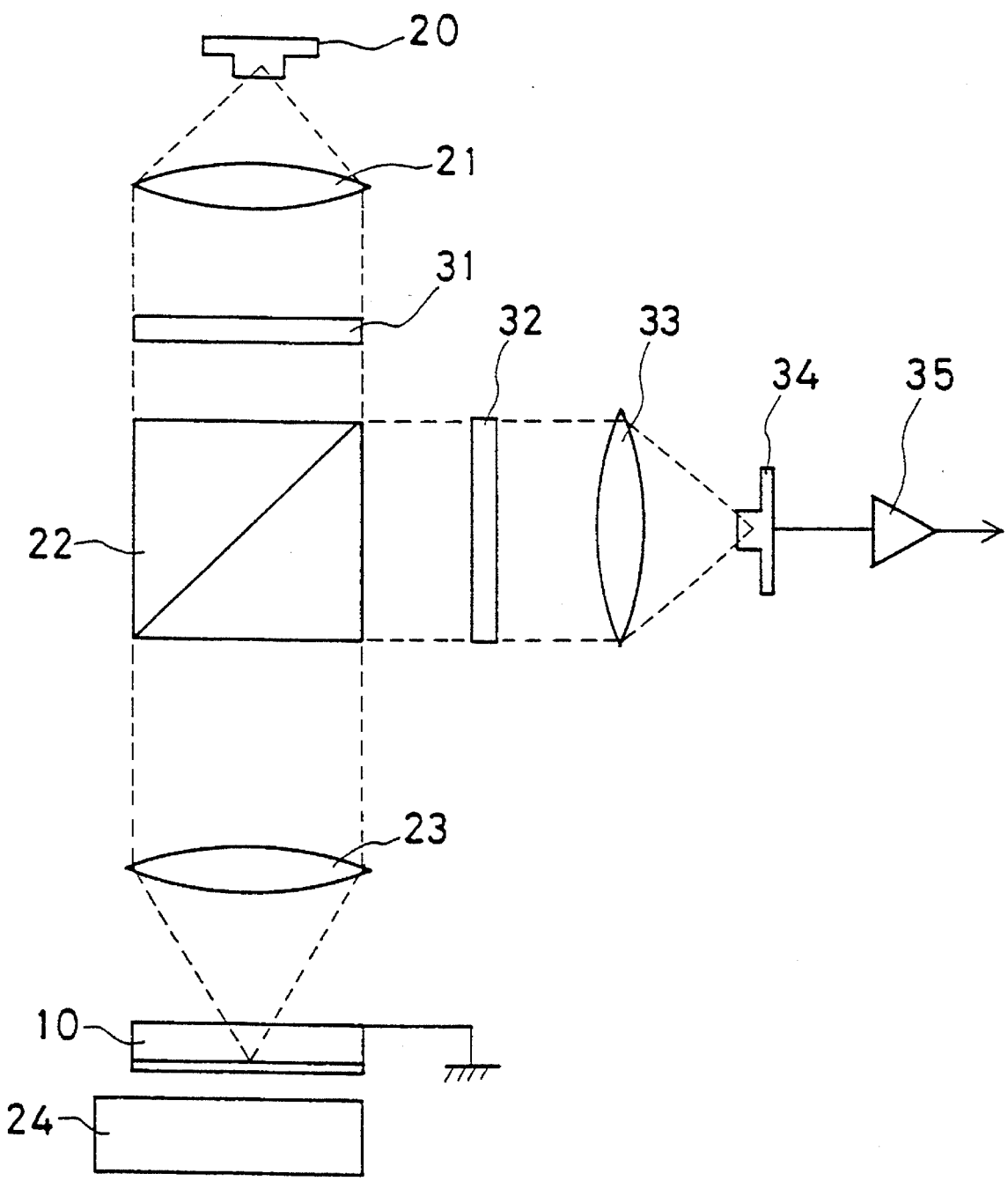
Figure 5:
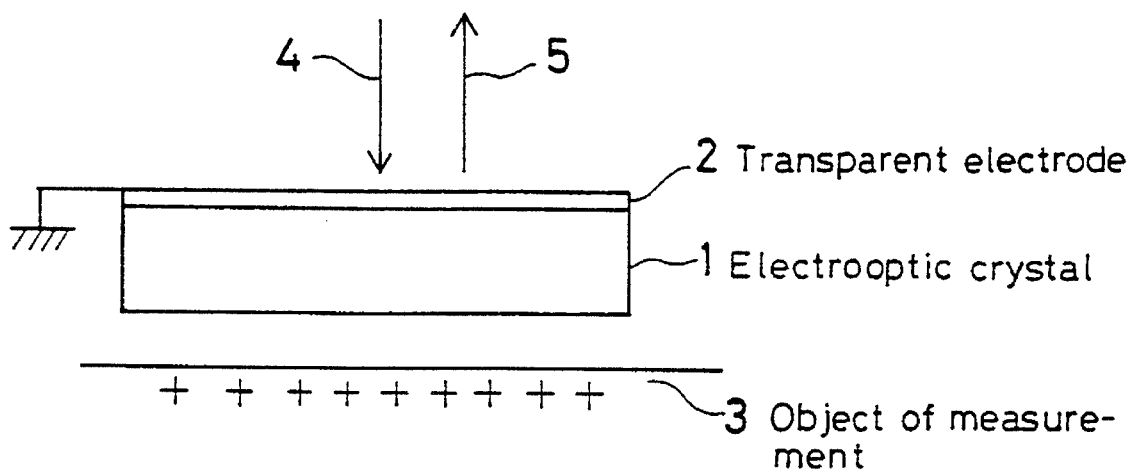
FIG. 5 illustrates an optical potential sensor.
Figure 6:
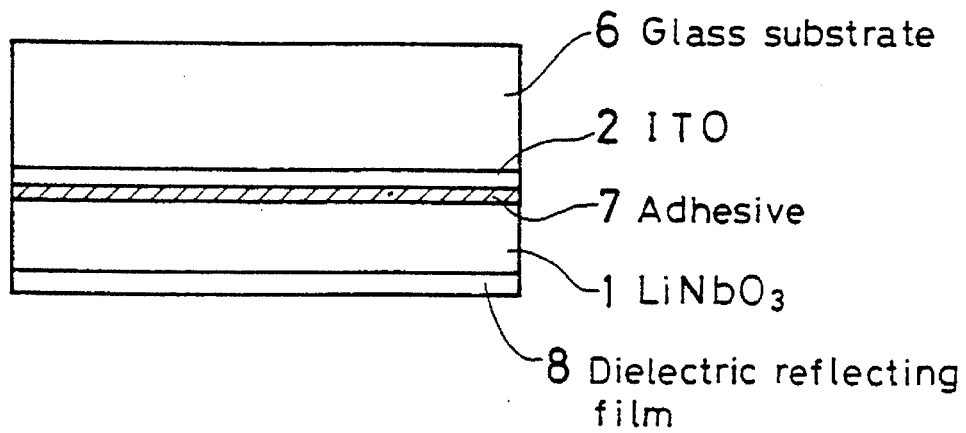
FIG. 6 shows the arrangement of a conventional potential sensor.

FIG. 3 shows the arrangement of another embodiment of a potential measuring apparatus employing the sensor of the present invention.

In this embodiment, light that is polarized in a specific direction through a polarizer 31 is applied to the sensor, and the reflected elliptically polarized light is detected through an analyzer 32, thereby detecting a change in the polarizing angle caused by the sensor, and thus measuring the potential of the object. In this case, the output of the potential measuring apparatus is proportional to $$\sin^2(\Delta\phi+\alpha)$$

The sensitivity of this apparatus is lower than that of the apparatus shown in FIG. 1.

The apparatuses shown in FIGS. 2 and 3 can measure the potential at one position on the object of measurement, and when the entire surface of the object is to be continuously measured, the entire surface must be scanned with the optical system and the object being moved relative to each other. In this case, the electrooptic crystal of the sensor section may be stationary relative to the optical system or relative to the object.

It should be noted that as the electrooptic crystal becomes thinner, the resolution becomes higher, and the numerical aperture of the objective lens must be optimized. On the other hand, the sensitivity becomes higher as the electrooptic crystal becomes thicker. Thus, the sensitivity is incompatible with the resolution.

In addition, it is necessary to determine the gap between the electrooptic crystal and the object in advance of the measurement. For this purpose, gap control may be effected by use of a servo mechanism. The gap control can be effected by moving either or both the object and the electrooptic crystal. When the electrooptic crystal is also moved, it is necessary to receive the reflected light from the electrooptic crystal with divided photodiodes and effect focusing on the electrooptic crystal by feedback-controlling the servo mechanism such that the difference between the quantities of light received by the photodiodes is minimized.

EXAMPLE 1

High-resistance ZnTe was epitaxially grown to a thickness of 20 μm by MOCVD on a low-resistance compound semiconductor substrate (100) made of GaP and having a thickness of 300 μm. When 100 V was applied to a conductor 40 from a power supply V, as shown in FIG. 4, an output change of 1% with respect to the incident light intensity was detected by the measuring apparatus shown in FIG. 2. In addition, it was possible to obtain an output change of from several % to several tens of % in accordance with the wavelength of the light employed.

EXAMPLE 2

High-resistance $CuGaS_2$ was epitaxially grown to a thickness of 10 μm on a low-resistance GaP (100) substrate by MOCVD, and a multilayer dielectric reflecting film of $SiO_2$ and $CaF_2$ was formed thereon by vapor deposition by electron-beam heating.

Thus, according to the present invention, the double refraction of a compound semiconductor is utilized, and a high-resistance compound semiconductor is epitaxially grown on a semiconductor doped with impurities so as to have a low resistance. It is therefore possible to form a sensor which has excellent processing characteristics, extremely high surface accuracy and minimal photo-deterioration.

INDUSTRIAL APPLICABILITY

The present invention can be utilized to measure the potential of an object, particularly, to read with high accuracy an electrostatic image on an electric charge retaining medium recorded by exposing it to an optical image under the application of a voltage.

What is claimed is:

1. A potential sensor employing an electrooptic crystal comprising a large bandgap compound semiconductor of high resistance of at least $10^5$ Ωcm which is formed by epitaxial growth on a large bandgap compound semiconductor substrate of low resistance of up to $10^1$ Ωcm, and wherein the substrate is connected to a ground reference potential.

2. A potential measuring method comprising:

providing a potential sensor employing an electrooptic crystal comprising a high-resistance compound semiconductor layer of at least $10^5$ Ωcm which is formed on a low-resistance compound semiconductor substrate of up to $10^1$ Ωcm by epitaxial growth, wherein said low-resistance compound semiconductor and said high resistance compound semiconductor each have a large bandgap;

disposing the potential sensor close to and in opposing relation with an object of measurement, with said low-resistance compound semiconductor substrate grounded;

irradiating the sensor with linearly, elliptically or circularly polarized light of a predetermined wavelength related to the bandgaps of the respective semiconductors of the potential sensor without inducing photoconductivity therein; and measuring the difference between polarization of light leaving the sensor and polarization of light incident on the sensor.

3. A method according to claim 2, comprising measuring difference between polarization of light reflected from the sensor and polarization of light incident on the sensor.

* * * * *